United States Patent
Ahrikencheikh (10) Patent No.: US 6,839,885 B2
(45) Date of Patent: Jan. 4, 2005

(54) DETERMINING VIA PLACEMENT IN THE PRINTED CIRCUIT BOARD OF A WIRELESS TEST FIXTURE

(75) Inventor: Cherif Ahrikencheikh, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 131 days.

(21) Appl. No.: 10/225,891

(22) Filed: Aug. 22, 2002

(65) Prior Publication Data

US 2004/0040008 A1 Feb. 26, 2004

(51) Int. Cl.$^7$ ................................................ G06F 17/50
(52) U.S. Cl. ............................ 716/9; 361/782; 716/12; 716/14; 716/15
(58) Field of Search ............................ 716/9, 12, 14, 716/15, 2, 10; 361/782; 430/313

(56) References Cited

U.S. PATENT DOCUMENTS 5,451,489 A  *  9/1995  Leedy ........................ 430/313
2003/0043560 A1  *  3/2003  Clarkson et al. ............ 361/782

* cited by examiner

Primary Examiner—Thuan Do (57) ABSTRACT

A method for determining via placement for wireless test fixture printed circuit boards (PCBs) utilizes the fixed test interface pattern of the bottom conductive pads to quickly locate the nearest bottom pad to a given top pad. The distance between the top pad and its nearest bottom pad is then calculable based on the coordinates of the respective pads on the PCB. If the distance is greater than a predetermined clearance requirement, a via is placed within the interior of the nearest bottom pad; otherwise, the via is placed exterior to the nearest bottom pad.

20 Claims, 8 Drawing Sheets

! total number of probes
3097
! probe/top pad x-y coordinates
13000 8550
12600 8450
12900 8550
12800 8550
12700 8550
12600 8550
13000 8450
...

! bottom pad x-y coordinates
12900 8400
12900 8100
12900 7800
12900 7500
12900 7200
12900 6900
12900 6600
...

! bottom pad x-y coordinates
! x-y coordinates of bottom pads,
! coordinates start with 1 for internal via placement, 0 for external
! via placement, and X for no via X 12900 8400
X 12900 8100
1 12900 7800
1 12900 7500
X 12900 7200
0 12900 6900
1 12900 6600
...

DETERMINING VIA PLACEMENT IN THE PRINTED CIRCUIT BOARD OF A WIRELESS TEST FIXTURE

FIELD OF THE INVENTION

The present invention pertains generally to fixtures of printed circuit board testers, and more particularly to techniques for determining via locations in printed circuit boards for wireless test fixtures.

BACKGROUND OF THE INVENTION

Printed circuit assemblies (PCA's) must be tested after manufacture to verify the continuity of the traces between pads and/or vias on the board and/or to verify that any components loaded on the PCA perform within specification.

Printed circuit assemblies testing requires complex tester resources. The tester hardware must be capable of probing conductive pads, vias and traces on the board under test.

Prior art test fixtures typically employed a bed of nails fixture comprising a large number of nail-like test probes having tips that make electrical contact with the nodal points of the circuit to be tested. The test probes are typically spring loaded pins inserted in receptacles that pass through and are secured relative to a supporting plate (called the probe plate). The printed circuit is placed on top of the test probes and sealed with a gasket. A vacuum is applied through the test fixture to draw the printed circuit board down onto the spring loaded test probes to ensure good electrical contact. The vacuum is maintained until the testing is complete after which another printed circuit board is placed onto the test fixture for testing.

The test probes are inserted into the receptacles which extend below the lower side of the probe plate. The lower end of the receptacle typically has a wire wrap post. A wire is wrapped about the receptacle post and extends in a point-to-point wiring connection to an interface connector pin inserted into a fixture interface panel. The fixture interface panel is adapted to be connected to an interface receiver of the test electronics analyzer. The point-to-point wiring of each receptacle post to a corresponding interface connector pin involves manually wire wrapping wires between each of the receptacle post and interface connector pin.

With the miniaturization of electrical components, the number of test points in a circuit has risen significantly, making point-to-point wiring for each fixture a labor intensive operation. Automation of this process is not economical because each printed circuit board requires a unique design configuration. Furthermore, as the number of test points increases with shrinking technology, the wiring of the closely adjacent test pins becomes more tedious.

Recent advances in fixture technology has led to the use of wireless fixtures. In a wireless fixture, a fixture printed circuit board (PCB) replaces the wires connecting the tester interface pins to the fixture probes with traces on a printed circuit board. In particular, the tester interface pins (either directly or indirectly through tester adapter probes interfacing to the tester pins) make electrical contact with conductive pads on the bottom side of the fixture PCB. The conductive pads on the bottom side of the fixture PCB electrically connect to conductive pads on the top side of the fixture PCB through traces and vias. One end of the probes of the fixture probe plate make electrical contact with the conductive pads on the top side of the PCB, while the other end of the probes of the fixture probe plate make electrical contact with various conductive pads/nodes of the printed circuit board under test. Accordingly, wireless test fixture allows tester pins to make electrical contact with appropriate nodes of the printed circuit board under test without the necessity and complexity of wire-wrap connections.

When a printed circuit board under test is to be tested using a wireless fixture, the tester interface pins (directly or indirectly through tester adapter probes) press on the fixture PCB upward at its bottom conductive pads. Simultaneously, the bottom tips of the fixture probes press against the fixture PCB downward against its top conductive pads. The top tips of the fixture probes press against the bottom conductive pads of the printed circuit board under test.

Although wireless test fixtures have been used for over a decade, the general perception is that the benefits they can theoretically provide are extremely difficult to realize in practice. One of these benefits is signal quality, which consists of whether the right amount of current is delivered and whether it is delivered in its full integrity.

Signal quality is affected by probe and pin contact against the fixture PCB, as well as the width of the PCB traces. Ideally, contact must be maintained with a sufficient force during test, and preserved with a minimum force outside of test to avoid contamination. The traces must be just wide enough to accommodate the delivery of the required current to each device under test. Too thin a trace may result in insufficient current, and too thick a trace may result in PCBs with too many layers, which are difficult and costly to manufacture. Layer count should also be reduced by avoiding unnecessary uses of the fixture PCB internal area; this can be obtained by moving screws to edges and corners, rarely mounting parts on the PCB surface, and minimizing the area occupied by traces and their vias.

There exist several designs of wireless fixtures, differing mainly in the probe types utilized, in mechanical assemblies effecting contact and parallelism, and in PCB design and layout. The main aim is at improving signal quality, fixture cost, PCB layer count, ease of use, and fixture repair.

SUMMARY OF THE INVENTION

The present invention is a technique for intelligently determining the placement of vias connecting the layers of the printed circuit board in order to reduce PCB complexity and layer count. In accordance with the invention, each top conductive pad of the PCB that is contacted by a fixture probe is processed in turn to locate a nearest bottom pad to said selected probe. The distance between the selected top pad and its nearest bottom pad is calculated and compared to a minimum clearance requirement. If the calculated distance is greater than or equal to the minimum clearance requirement, a via is placed internal to the respective nearest bottom pad; otherwise, the via is placed external to the nearest bottom pad.

In the preferred embodiment, since the bottom conductive pads of the PCB interface to a standard test interface pin/probe pattern, the locations and spacing of the bottom conductive pads are known. Accordingly, given the location of a respective top conductive pad, its nearest bottom conductive pad may be easily calculated in a minimal number of steps, preferably a constant (O(1)) number of operations independent of the number of bottom pads. Once the nearest bottom conductive pad is identified, its location is known and is used in calculating the distance between the top conductive pad and its nearest bottom conductive pad to determine whether the distance meets the required clearance requirements.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method for intelligently determining the placement of vias of a wireless fixture printed circuit board is described in detail hereinafter. Although the invention is described in terms of specific illustrative embodiments, it is to be understood that the embodiments described herein are by way of example only and that the scope of the invention is not intended to be limited thereby.

Figure 1:
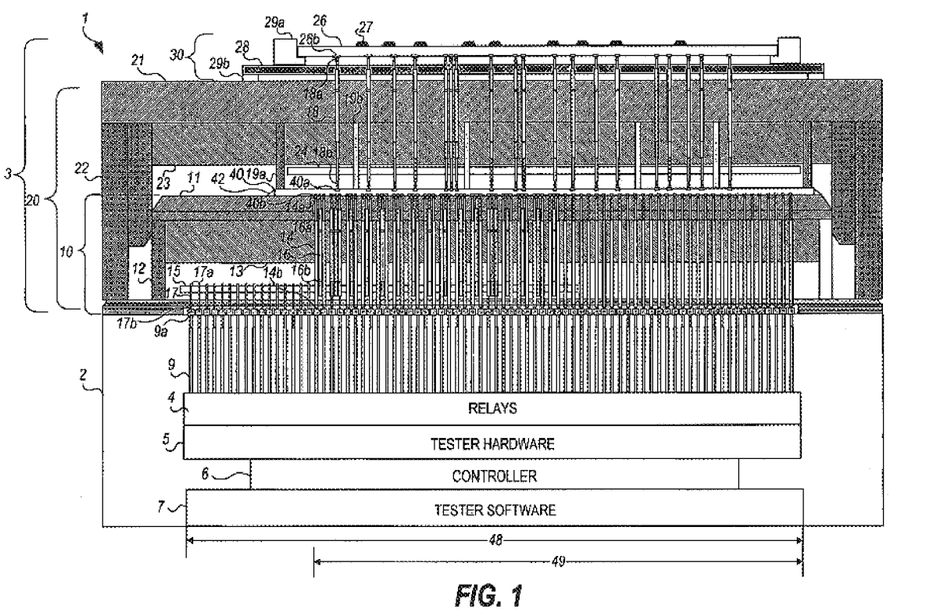
FIG. 1 illustrates a test system utilizing a wireless printed circuit board in accordance with the invention.

Turning now to the invention, FIG. 1 illustrates a wireless fixture test system 1. Test system 1 includes a tester 2, a wireless fixture 3, and a device under test (DUT) mount 30. Tester 2 includes a plurality of test interface pins 9 arranged in an array along the top side of the tester 2. Tester 2 includes tester hardware 5 which operates under the control of a controller 6. Controller 6 may be controlled by tester software 7, which may execute within the tester 2 itself, or remotely via a standard communication interface. One function of the controller 6 is to configure the hardware 5 to make or not make electrical connections between measurement circuits within the tester and each of the test interface pins 9. To this end, each test interface pin 9 is connectable to or isolated from the tester hardware by a relay 4. Electrical contact may be made with a respective test interface pin 9 by closing the relay; conversely, the pin 9 may be isolated from the test hardware by opening the relay 4.

Mounted on top of the tester and over the tester interface pin 9 field is the test adapter 10. The fixture PCB adapter 10 comprises an adapter top plate 11 and an adapter guide plate 13 which together are supported by sidewalls 12. Adapter 10 includes a plurality of solid floating probes 14 that are inserted through precisely aligned holes in the guide/plate 13 and top plate 11. Guide plate 13 ensures precise vertical alignment of solid floating probes 14.

In the embodiment shown, the adapter 10 also includes a probe field shrinking printed circuit board (PCB) 15 which is used to translate the relatively larger field of test interface pins 9 of the tester 2 to a relatively smaller probe field the size of the fixture PCB 40. In particular, in this embodiment, the probe field shrinking PCB 15 comprises a plurality of pins 17 that connect on one end to the top tips of certain test interface pins 9 of the tester and on the other end to conductive traces on the probe field shrinking PCB 15 which route to conductive pads on the top side of the probe field shrinking PCB 15. The adapter includes a plurality of single-ended spring probes 16 whose bottom tips electrically contact the conductive pads on the top side of the probe field shrinking PCB 15. The single-ended spring probes 16 are also inserted through precisely aligned holes in the guide/plate 13 and top plate 11.

The fixture PCB adapter 10 is mounted over the test interface pin 9 field such that the bottom tips of the solid floating probes 14 and the bottom tips of the probe field shrinking PCB pins 17 align with and make electrical contact with the top tips of corresponding test interface pins 9 of the tester 2, as shown.

A fixture (wireless) printed circuit board (PCB) 40 is mounted with screws to the probe plate 21, which in turn is attached to the fixture frame 20 such that the top tips of the solid floating probes 14 and the top tips of the single-ended spring probes 16 align with and make electrical contact with conductive pads 40b on the bottom side of the fixture PCB 40. The conductive pads 40 on the bottom side of the fixture PCB 40 electrically connect to conductive pads 40a on the top side of the fixture PCB 40 by traces and vias, and possibly through several intervening conductive layers of the PCB 40.

The fixture frame 20 includes a guide plate 21 and a reinforcement plate 23 supported by sidewalls 22, and an guide plate 24. Fixture frame 20 includes a plurality of double-ended spring probes 18 that are inserted through precisely aligned holes in the guide plate 21, guide/plate 23 and guide plate 24. Plastic spacers 19b and/or standoffs 19a prevent deflection and/or warping of the fixture PCB 40 due to imbalanced vertical forces when the assembly is vacuum compressed during test of a PBC under test 26 (hereinafter DUT 26).

Frame 20 is positioned over the fixture adapter 10, precisely aligning the bottom tips of the double-ended spring probes 18 onto conductive pads on the top of the fixture PCB 40 to ensure electrical contact.

The DUT mount 30 includes a support plate 28 mounted on the top side of the frame guide plate 21 by foam or spring gaskets 29b. Foam or spring gaskets 29a are also mounted on the top side of the support plate 28 to allow a DUT 26 such as a printed circuit board to be mounted thereon. The printed circuit board 26 may be loaded, including one or more electrical components 27 attached thereto, or may be a bare board.

When a DUT 26 is to be tested, the tester interface pins 9 press on the fixture PCB 40 upward at its bottom conductive pads 40*b* (indirectly through the probes 14, 16 of the fixture adapter 10). Simultaneously, the bottom tips of the double-ended probes 18 press against the fixture PCB 40 downward against its top conductive pads 40*a*. The top tips of the double-ended probes 18 press against the bottom conductive pads 26*b* of the DUT 26. During test of the DUT 26, the test software 7 directs the controller 6 to configure the tester hardware 5 to make connections between certain tester interface pins 9 of interest to measurement circuits within the tester hardware 5. The tester hardware 5 may then make measurements of the device or pad under test according to software instruction.

Figure 2:
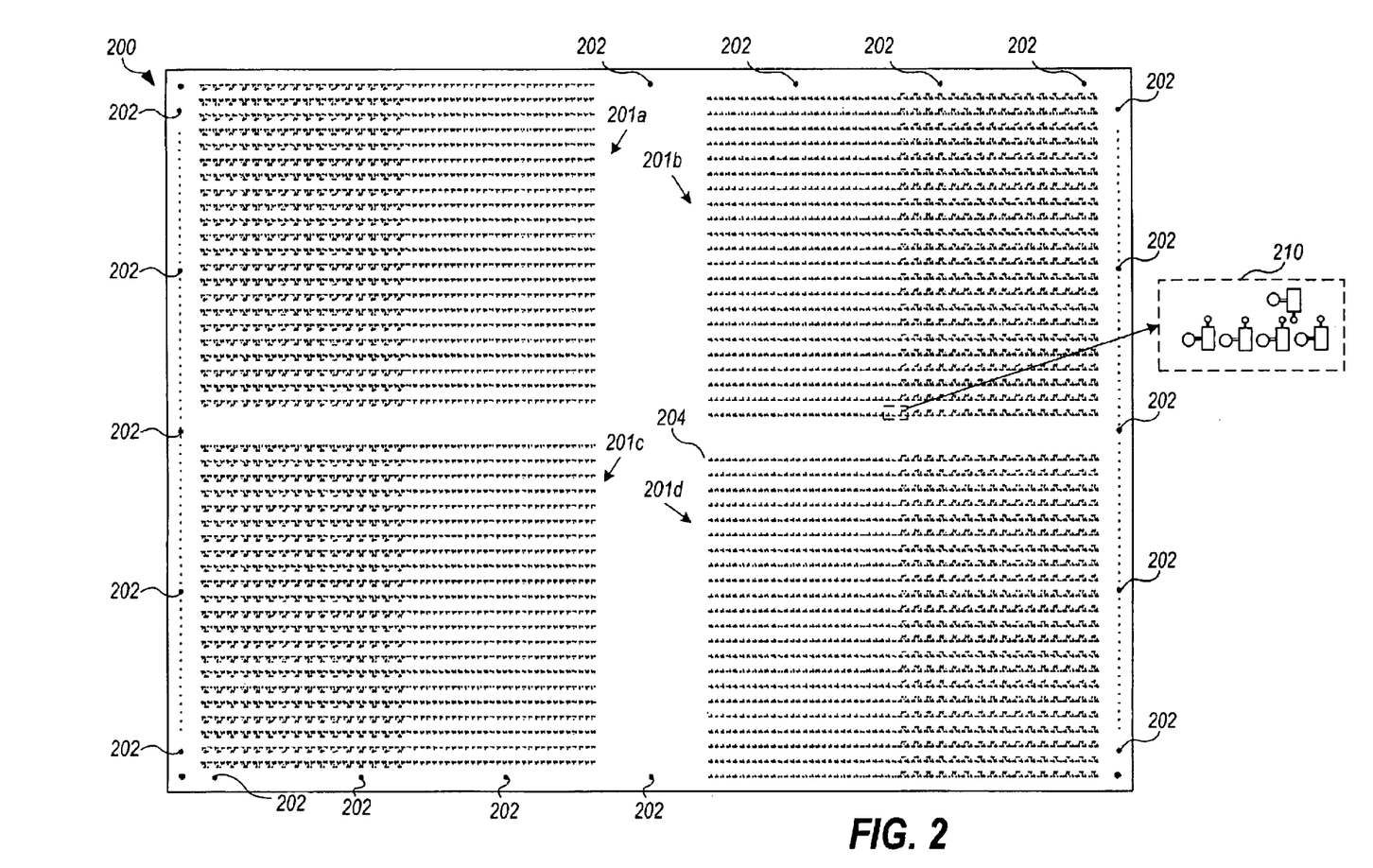
FIG. 2 is a bottom view of an example embodiment of a wireless printed circuit board for use in the test fixture of FIG. 1.

FIG. 2 shows the bottom view of an example embodiment of a wireless printed circuit board 200 for use in the test fixture of FIG. 1. As illustrated, the bottom side of the PCB comprises four arrays 201*a*–201*d* of conductive pads 204. The traces may be routed through several intervening PCB layers, traveling from layer to layer by way of vias. In the illustrative embodiment, the position of the conductive pads correspond to the position of the probes 14, 16 of the tester adapter 10. When mounted on the adapter 10, each probe 14, 16 exactly lines up with and contacts a corresponding respective conductive pad 204 on the fixture PCB 200. Pads 204*a*–204*d* are magnified in bubble 210 for convenience of illustration. To form an electrical connection, the top tip of a given probe 14, 16 physically contacts the larger circular portion of a respective conductive pad 204. These conductive pads 204 connect via traces to conductive pads (not shown) on the top side of the PCB 200.

Figure 3:
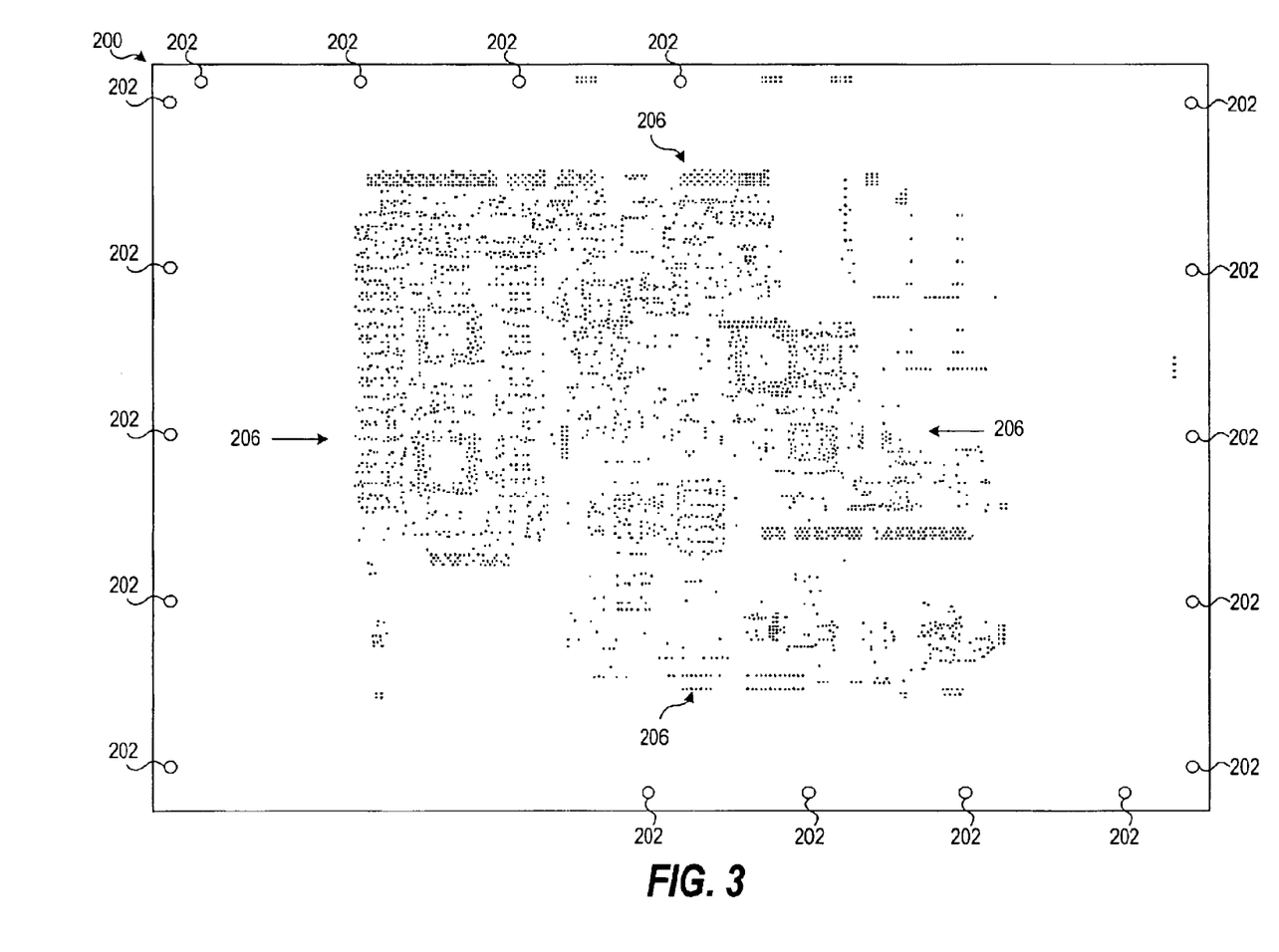
FIG. 3 is a top view of an example embodiment of the wireless printed circuit board of FIG. 2.

FIG. 3 shows the top view of the wireless PCB 200. As illustrated, the top side of the PCB 200 comprises a plurality of conductive pads 206. These conductive pads 206 connect via traces to conductive pads 204 (FIG. 9) on the bottom side of the PCB 200. In the illustrative embodiment, the position of the conductive pads 206 correspond to the position of the fixture probes 18 of the fixture 2. When the fixture frame 20 is positioned on the tester over the adapter 10, each probe 18 exactly lines up with and contacts a corresponding respective conductive pad 206 on the top side of the fixture PCB 200.

As illustrated in FIGS. 2 and 3, the PCB includes a number of screw holes 202 at the peripheral edges of the board. These holes are used to attach the PCB 200 to the probe plate 21 using screwed-in standoffs.

Figure 4:
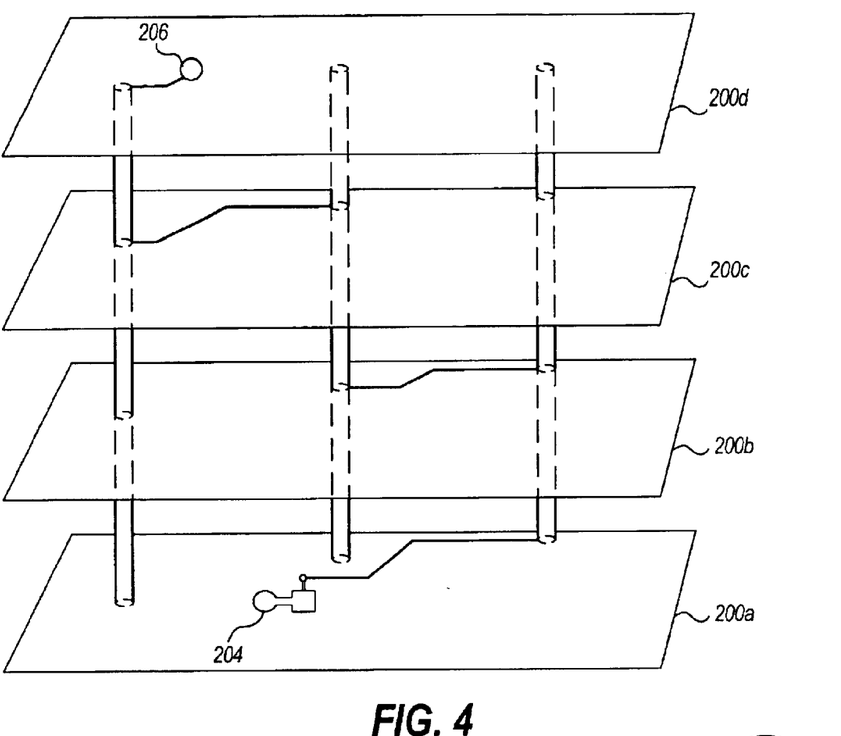
FIG. 4 is an exploded perspective view of a portion of a PCB illustrating connection of a bottom conductive pad on the bottom side of the PCB to a top conductive pad on the top side of the PCB.

FIG. 4 is an exploded perspective view of a portion of a PCB 200 illustrating connection of a bottom conductive pad 204 on the bottom side of the PCB 200 to a top conductive pad 206 on the top side of the PCB 200. As illustrated, the PCB 200 comprises a plurality of metal layers 200*a*, 200*b*, 200*c*, 200*d* separated by dielectric layers (not shown). In the embodiment shown, the metal layers 200*a*, 200*b*, 200*c*, 200*d* include a bottom layer 200*a* on which the bottom conductive pads 204 are implemented, a second intermediate layer 200*b*, a third intermediate layer 200*c*, and a top layer 200*d* on which the top conductive pads 206 are implemented. A first trace 212*a* on the bottom layer connects a bottom conductive pad 204 to a first via 214*a*. The first via 214*a* connects the first trace 212*a* to a second trace 212*b* implemented on the second intermediate layer 200*b*. The second trace 212*b* on the second intermediate layer 200*b* connects the first via 214*a* to a second via 214*b*, which connects the second trace 212*b* to a third trace 212*c* implemented on a third intermediate layer 200*c*. The third trace 212*c* connects the second via 214*b* to a third via 214*c*, which connects the third trace 212*c* to a fourth trace 212*d* implemented on the top layer 200*d*. Accordingly, traces 212*a*, 212*b*, 212*c*, 212*d* route a signal from the bottom conductive pad 204 to the top conductive pad over several layers 200*a*, 200*b*, 200*c*, 200*d*, progressing from one layer to the next using vias 214*a*, 214*b*, 214*c*.

Figures 5A, 5B:
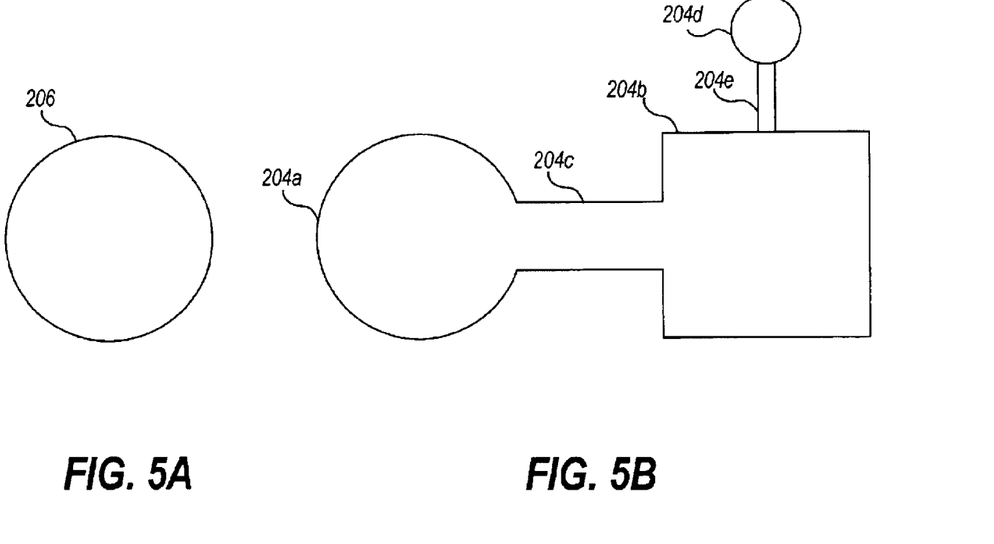
FIG. 5A illustrates a top conductive pad of the PCB of FIGS. 2 and 3.
FIG. 5B illustrates a bottom conductive pad of the PCB of FIGS. 2 and 3.

As known in the art, the conductive pads of a printed circuit board can have a variety of shapes and designs. These shapes/designs can range from a simple circle or polygonal shape to a combination of these and other geometric shapes. In the illustrative embodiment, the top conductive pads 206 are implemented as circular shapes 206*a*. The bottom conductive pads 204 comprise a larger circular shape 204*a* against which presses the probes interfacing with the test system, connected by a connection 204*c* to a four-sided (rectangular or square) shape 204*b*. The four-sided shape 204*b* is connected to a trace launching pad 204*d* by a connector 204*e* from which originate the traces that connect to the top pads. (Although not relevant to the invention claimed herein, in the illustrative embodiment, the four-sided shape 204*b* is used for engineering change orders (ECOs), whereby if the routing of a trace must be changed, the connection 204*e* is cut and a new connection (wire or trace) is physically added, launching from the four-sided shape). FIG. 5A illustrates a top conductive pad 206, and FIG. 5B illustrates a bottom conductive pad 204 used in the illustrative embodiment.

Figures 6A, 6B:
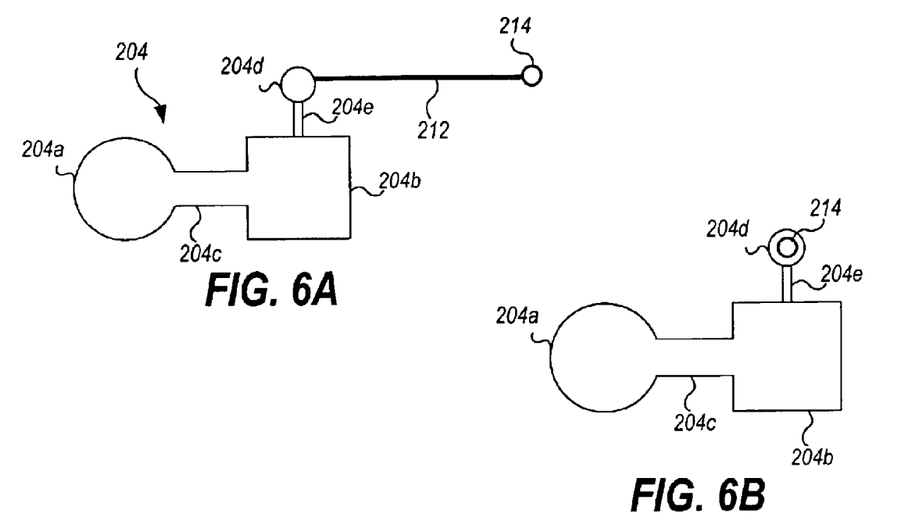
FIG. 6a is a diagram of a via located away from a bottom conductive pad.
FIG. 6B is a diagram of a via located within a bottom conductive pad.

Referring to FIG. 5B, there are two different possibilities for a trace 204*e* to progress from the trace launching portion 204*b* of a bottom conductive pad 204 to another layer 200*b*, 200*c*, 200*d* using a via 204*d*. The first possibility is that the via 214 can be located away from the pad 204 and connected with a trace 212, as illustrated in FIG. 6A. The second possibility is that the via 214 can be located within the conductive pad 204 itself (in particular, in the preferred embodiment of FIG. 5B within the trace launching portion 204*d*) of the pad, as illustrated in FIG. 6B. The second configuration (FIG. 6B) is preferred because the trace 212 between the pad 204 and via 214 is eliminated, which in printed circuit boards with hundreds or thousands of pads 204, can result in reduced printed circuit board complexity and layer count.

Clearly, a via 214 inside a top pad 206 of the fixture PCB 200 will interfere with achieving good electrical contact with the corresponding fixture probes 18. Accordingly, it is desirable that none of the top conductive pads 206 have vias 214 on their interior.

On the other hand, since the trace launching portion 204*d* of the bottom conductive pad 204 will not be in contact with any probe or pin, it may be allowed to have a via 214 in its interior. However, the exit of the via 214 on the top surface of the printed circuit board 200 can coincide or interfere with a top conductive pad 206, which is unacceptable.

To achieve via placement optimization, the router software must be instructed of all the bottom conductive pads 204 in which an interior via does not interfere with the top pads. Determining whether a given bottom conductive pad 204 interferes with a single top conductive pad 206 may be accomplished by comparing the origin and diameter of the top pads against the center of the trace launching portion 204*b* of the bottom conductive pad 204 in question. FIGS.

Figure 7A:
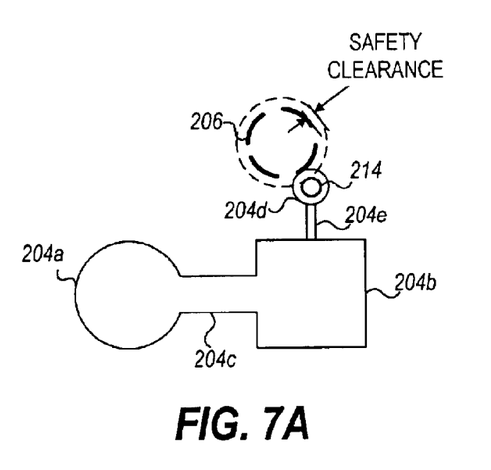
FIG. 7A is a pad diagram illustrating a top pad that interferes with a via placed internal to a bottom conductive pad.
Figure 7B:
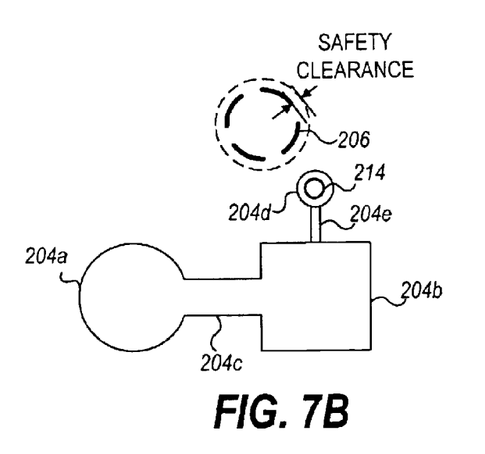
FIG. 7B is a pad diagram illustrating a top pad that meets the clearance distance requirements and therefore does not interfere with a via placed internal to a bottom conductive pad.

7A and 7B respectively illustrate examples of interfering and non-interfering vias.

Because there can be thousands of top conductive pads against which to compare every one of thousands of bottom conductive pads, a more efficient algorithm for determining placement of vias associated with bottom conductive pads is desirable.

Figure 8:
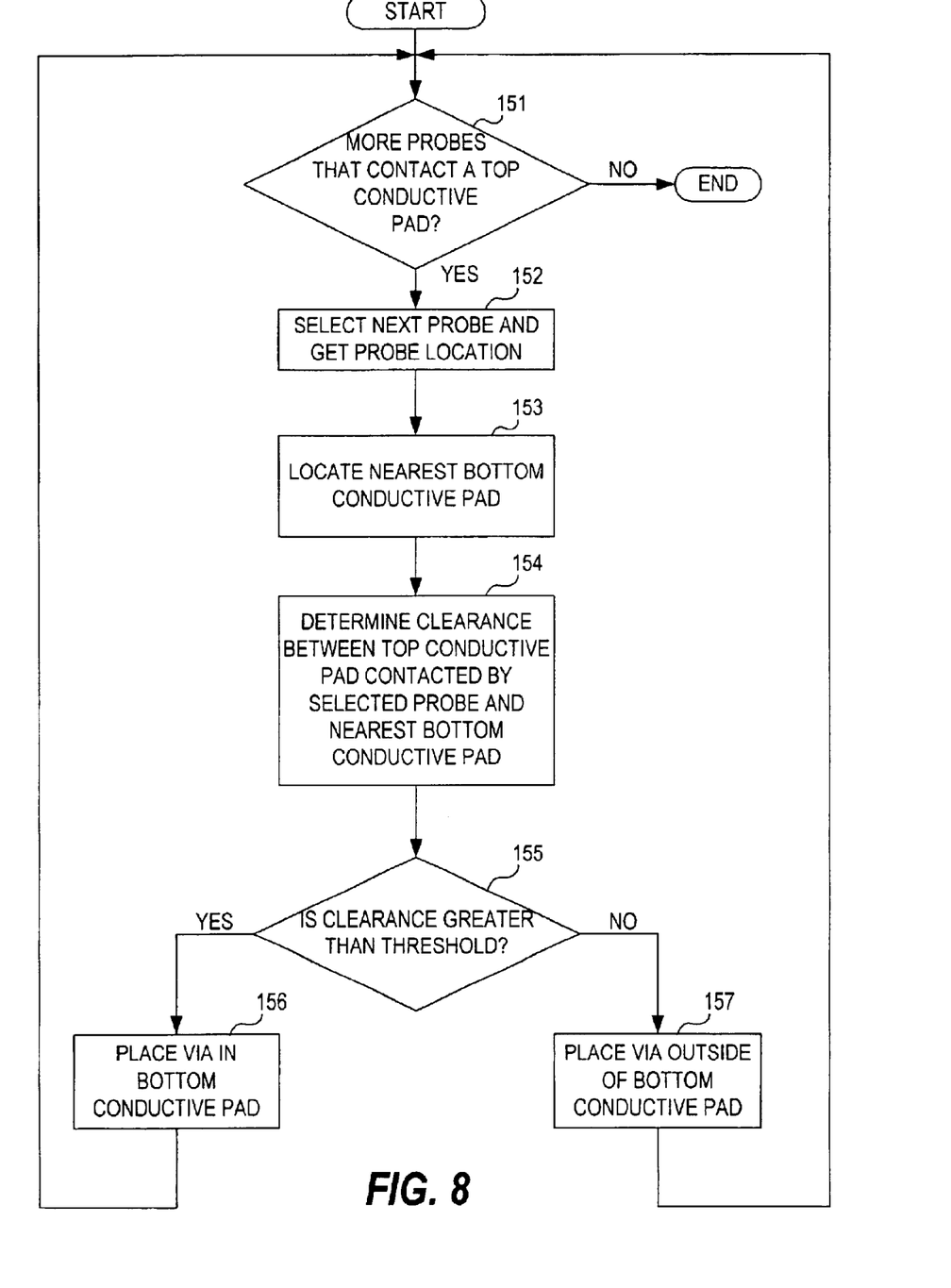
FIG. 8 is a flowchart of the method of the invention.

FIG. 8 is a flowchart illustrating a fast algorithm 150 for determining all of the bottom conductive pads 204 of a PCB 200 that do not interfere with any top conductive pads 206 of the PCB 200. Key to the preferred embodiment of the algorithm 150 is that since the positions of the tester interface probes/pins remain the same from DUT design to DUT design, the pattern of the bottom conductive pads on the bottom side of the PCB 200 remains the same from fixture PCB design to fixture PCB design. Accordingly, the geometry of the PCB bottom conductive pads 204 is known, and therefore the distances between each of the bottom conductive pads 204 on the PCB 200 is known.

Figure 9:
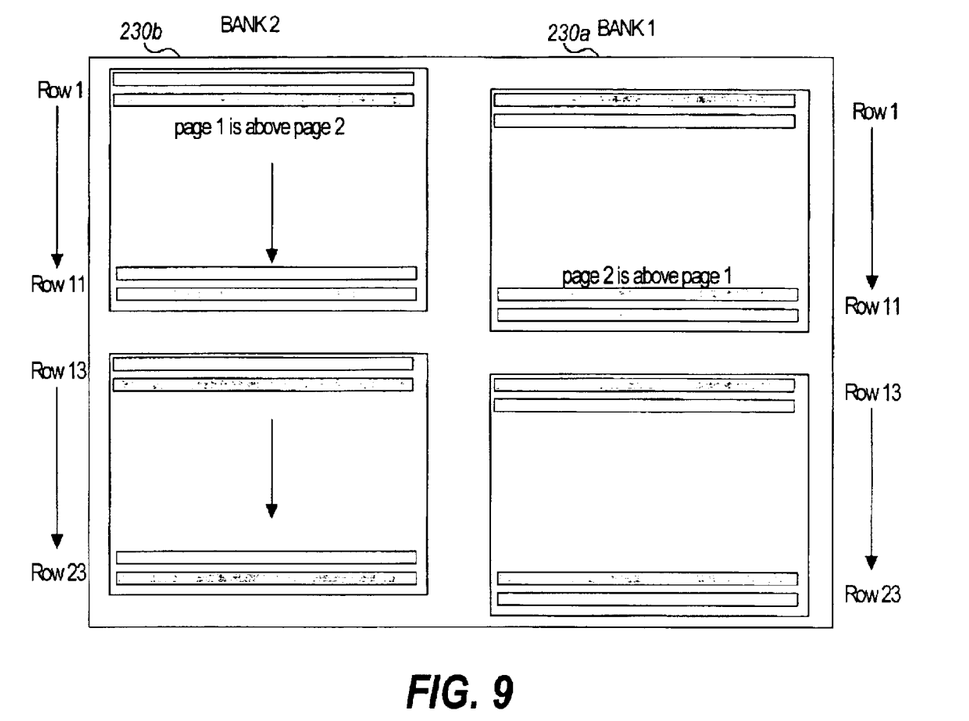
FIG. 9 is a geometric diagram illustrating the layout of the bottom conductive pads.

The PCB 200 may be conveniently subdivided into (x, y) coordinates as shown in FIG. 9. Each pad may correspond to a different x, y coordinate in the PCB coordinate system. The distance between a given bottom conductive pad 204 and another bottom conductive pad may be ascertained by taking the difference between the x, y coordinates of the two pads. Since the PCB pad layout geometry is fixed from one PCB design to the next, the distances between the pads may optionally be stored and used by the algorithm.

Referring again to FIG. 8, the algorithm begins by determining (step 151) whether any of the probes 18 that contact a top conductive pad of the PCB 200 remain to be processed. If so, an unprocessed probe 18 that will contact a top conductive pad 206 is selected (step 152). The x, y coordinates of the selected probe are obtained. The nearest bottom pad to the selected probe in terms of x, y coordinates is then located (step 153). In the preferred embodiment, since the bottom PCB geometry is fixed, the nearest bottom pad may be obtained in a minimal number of operations. An example Illustrating a method for locating the nearest bottom conductive pad to a given top conductive pad is described hereinafter. The amount of clearance between the top conductive pad contacted by the selected probe and the nearest bottom conductive pad is then calculated (step 154). If the amount of clearance is determined (step 155) to meet or be greater than a predetermined acceptable clearance threshold, a via is placed within the bottom conductive pad (step 156). In the alternative, if the amount of clearance is determined (step 155) to be less than the predetermined acceptable clearance threshold, a via is placed outside of the bottom conductive pad (step 157). Steps 156 and 157 may be achieved by indicating to a router tool that a via should be placed within or outside of a given bottom conductive pad.

Turning now to the illustrative embodiment, the bottom conductive pads 204 of the PCB 200 shown in FIG. 2 are organized into four arrays of twenty-two rows and 78 columns. FIG. 9 is a geometric diagram illustrating the layout of the arrays. As illustrated, the arrays are arranged into two different banks 230a and 230b—one on the left-hand-side and one on the right-hand-side. Each bank 230a and 230b has 44 rows and 78 columns of pads 204 (as shown in FIG. 2).

For reasons beyond the scope of the present invention, the left bank 230a is offset by a single row from the right bank 230b. The 44 rows are grouped into 22 pairs of rows, referred to as "rows of pages". Accordingly, each pad 204 is defined by its bank, a page row, a column, and a page in the row (page 1 or 2).

In the preferred embodiment, the location of the nearest bottom pad is calculated in a minimal number of operations, preferably a constant (order of one (O(1)) number of operations independent of the number of bottom pads. In the illustrative embodiment, each pad is assigned an identifier (ID) based on its respective bank, page row, column, and page using the following formula (Formula 1):

if row<=11: id=(bank−1)*44*78+(2*(row−1)+page−1)*78+column+1;

if row>11: id=(bank−1)*44*78+(2*(row−2)+page−1)*78+column−1;

where:
bank can be either 1 (right) or 2 (left);
page can be either 1 (bottom in bank 1, top in bank 2) or 2,
row from 1 to 23 (top to bottom); and
column can range from 1 to 78 in each bank (from right to left).

In the illustrative embodiment, row 12 is skipped in the notation; accordingly the row numbers range from 1 to 11 and 12 to 23. For this reason, the calculations must be treated differently depending on whether the row is 1 to 11 or 12 to 23 (hence, the use of "row −1" if row is less than or equal to 11 and "row −2" if row is greater than 11 in the above formula).

Since the positions of the bottom conductive pads 204 of the PCB 200 are fixed (i.e., must match the fixed position of the tester interface pins/probes), the locations where the first column of each bank starts, the first row in each quadrant of the PCB, and the spacing between columns and rows are also fixed and therefore known values for each PCB design. Given these known locations and predetermined spacing distances, the question of whether a given probe location (given x, y coordinates) lies in the left bank 230a or the right bank 230b is easily determined by simply checking if the probe x-coordinate is greater than half of the width of the PCB. The closest row can be found by checking if the probe y-coordinate is in the upper or lower half, then dividing its value in that half by the row spacing. This also can tell us which page (1 or 2) the closest bottom conductive pad lies in depending on the value of Y with respect to the pair of pages in the row. Similarly, the column index may be determined by first determining which bank then dividing the value of the probe x-coordinate in that bank by the known column spacing. These values of bank, row, page, and column used in the formula above will give the id of the closest pad.

In the illustrative embodiment, 16 of the 78 columns on the left of the left bank 230a and 16 of the 78 columns on the right of the right bank 230b are offset by a well-defined distance Δx, Δy. A simple additional check can be performed to determine the actual column index.

As described above, the nearest bottom pad location is calculable in a constant number of operations independent of the number of bottom pads. In particular, the bank, page row, column, and page associated with the coordinate of the top pad is first determined and then used in Formula 1 above to determine the location of the nearest bottom pad.

Figure 10:
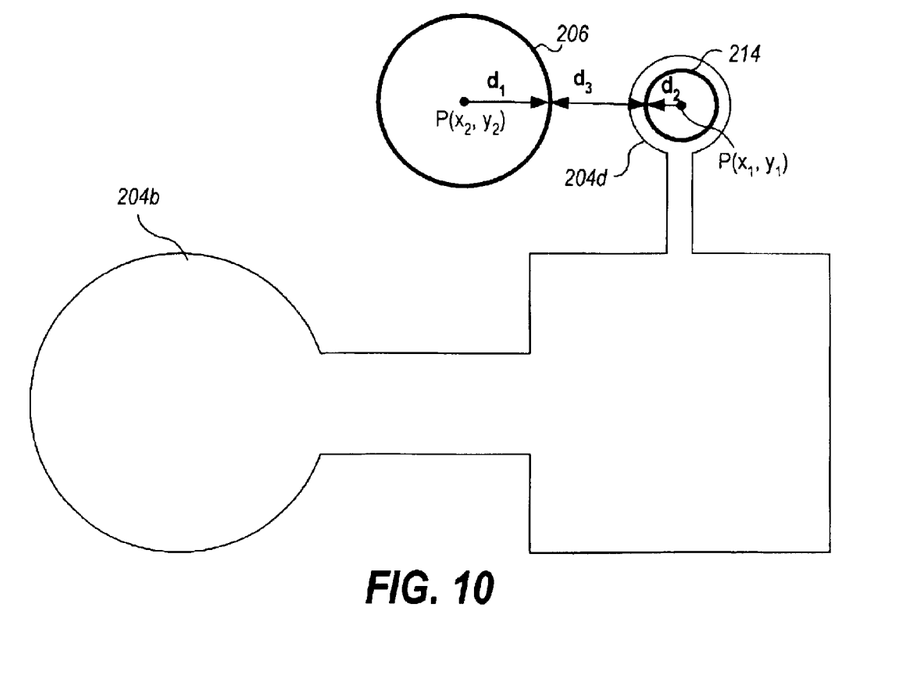
FIG. 10 is a diagram of a top pad and bottom pad illustrating the calculation of clearance.

FIG. 10 illustrates the calculation of clearance for a top conductive pad 206 whose center is defined by location P(x1, y1) and nearest bottom conductive pad 204 whose trace launching pad center is defined by location P(x2, y2). The diameter of the top conductive pad is a known value $d_1$, and the diameter of the proposed via 214 is also a known value $d_2$. Accordingly, the clearance distance $d_3$ is calculated as:

$$d_3 = \text{total distance} - d1 - d2$$
$$= ((x1-x2)^2 + (y1-y2)^2)^{\frac{1}{2}} - d1 - d2$$

The clearance distance $d_3$ can then be compared to a predetermined minimum clearance value (threshold) to determine whether the insertion of a via 214 inside the trace launching pad 204b of the bottom conductive pad 204 will interfere with the location of the top pad 206.

Figure 11:
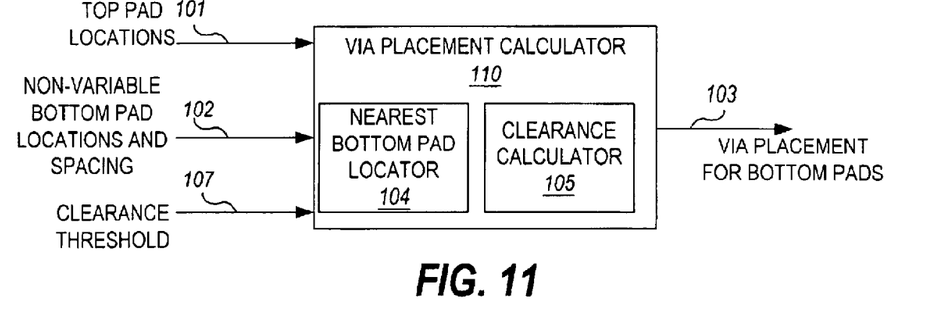
FIG. 11 is a block diagram of a system for determining the placement of vias with respect to the bottom conductive pads.

FIG. 11 is a block diagram of a system 110 for determining the placement of vias with respect to the bottom conductive pads. The via placement calculator 110 receives a list 101 of top conductive pad locations corresponding to fixture probes and a list 102 of the nonvariable bottom conductive pad locations and relative spacing information. Of course, the top pad location list 101 and bottom pad location list 102 may coexist in a single file, or be stored in separate files and/or locations in the system.

As shown in FIG. 11, the via placement calculator 110 includes a nearest bottom pad locator 104 and a clearance calculator 105. For each top pad in the top pad location list 101, the via placement calculator 110 instructs the nearest bottom pad locator 104 to find the bottom pad nearest to the given top pad. The via placement calculator 110 then instructs the clearance calculator 105 to determine whether or not a via placed within the nearest bottom pad meets the clearance requirements 107 of the board. If so, the via placement calculator 110 places a via in the respective bottom pad. When all top pads in the top pad location list 101 have been processed, the via placement calculator 110 generates a via location list 103 containing a list of the bottom pads and an indication of whether a via should be place inside of or outside of each bottom pad in the list.

Figures 12, 13, 14:
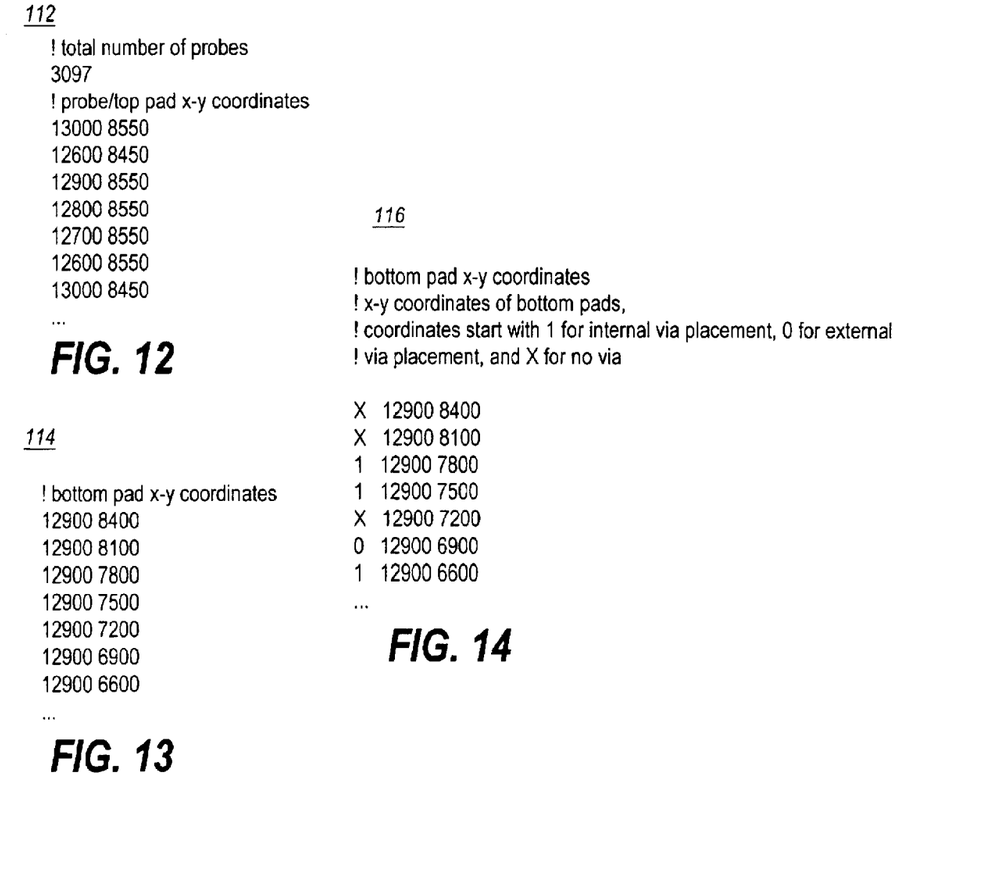
FIG. 12 is a sample portion of a top pad list for input to the via placement calculator.
FIG. 13 is a sample portion of a bottom pad list for input to the via placement calculator of FIG. 11.
FIG. 14 is a sample portion of an output file generated by the via placement calculator of FIG. 11.

FIG. 12 is a sample portion 112 of a top pad list 101 for input to the via placement calculator 110. As illustrated, the PCB under consideration has been segmented into a number of discrete x-y coordinates. The location of every probe and pad may be mapped to one of these x-y coordinates. As illustrated, according to the sample portion 112 of input file 101, the PCB under consideration is contacted by 3097 fixture probes, each connecting to a top conductive pad of the PCB.

FIG. 13 is a sample portion 114 of a bottom pad list 102 for input to the via placement calculator 110. This list generally does not change from PCB design to PCB design since the configuration of the test interface pins/probes does not change.

FIG. 14 is a sample portion 116 of an output file 103 output by the via placement calculator 110. As illustrated, for each pad location, the via placement calculator 110 calculated whether or not a via should be placed within the pad itself. As noted in the comments to the output file 114, a "1" precedes the bottom pad coordinates when a via is to be placed within the bottom pad, a "0" precedes the bottom pad coordinates when a via is to be placed outside the bottom pad, and an "X" precedes the bottom pad coordinates when no via is to be associated with the pad.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for determining placement of vias on a PCB, said PCB comprising a plurality of top pads on a top side of said PCB and a plurality of bottom pads on a bottom side of said PCB, said method comprising:

selecting a probe that will contact a selected top pad of said PCB;

locating a nearest bottom pad of said PCB nearest to said selected top pad that will be contacted by said selected probe;

calculating a clearance distance between said selected top pad and said nearest bottom pad, said clearance distance comprising a minimum distance between a perimeter of said selected top pad and a perimeter of a via in a proposed via position within said nearest bottom pad; and determining whether said via may be placed internal to said nearest bottom pad based on said calculated clearance distance.

2. A method in accordance with claim 1, further comprising:

placing said via that may be placed internal to said nearest bottom pad in said proposed via position if said calculated clearance distance meets a predetermined minimum clearance distance threshold.

3. A method in accordance with claim 2, further comprising:

placing a via external to said nearest bottom pad if said calculated clearance distance does not meet a predetermined minimum clearance distance threshold.

4. A method in accordance with claim 3, further comprising:

repeating said selecting step through said determining step until all probes that contact a top conductive pad of said PCB have been processed.

5. A method in accordance with claim 1, further comprising:

repeating said selecting step through said determining step until all probes that contact a top conductive pad of said PCB have been processed.

6. A method in accordance with claim 1, wherein said step locating said nearest bottom pad comprises:

obtaining coordinates associated with said selected top pad;

obtaining coordinates associated with said plurality of bottom pads;

calculating a distance between each of said plurality of bottom pads and said selected top pad based on said coordinates associated with said selected top pad and each of said coordinates associated with said plurality of bottom pad;

selecting a bottom pad resulting in a smallest distance calculation.

7. A method in accordance with claim 1, wherein said step for locating said nearest bottom pad comprises:

obtaining location coordinates associated with said selected top pad;

finding a bottom pad having coordinates of a closest match to said location coordinates associated with said selected top pad.

8. A method in accordance with claim 7, wherein said finding step comprises:

calculating coordinates of said bottom pad having coordinates of said closest match in a constant number of operations independent of the number of said bottom pads.

9. A method in accordance with claim 1, further comprising:

placing a via external to said nearest bottom pad if said calculated clearance distance does not meet a predetermined minimum clearance distance threshold.

10. A method in accordance with claim 9, wherein said step for locating said nearest bottom pad comprises:

obtaining coordinates associated with said selected top pad;

obtaining coordinates associated with said plurality of bottom pads;

calculating a distance between each of said plurality of bottom pads and said selected top pad based on said coordinates associated with said selected top pad and each of said coordinates associated with said plurality of bottom pad;

selecting a bottom pad resulting in a smallest distance calculation.

11. A method in accordance with claim 9, wherein said step locating said nearest bottom pad comprises:

obtaining location coordinates associated with said selected top pad;

finding a bottom pad having coordinates of a closest match to said location coordinates associated with said selected top pad.

12. A method in accordance with claim 11, wherein said finding step comprises:

calculating coordinates of said bottom pad having coordinates of said closest match in a constant number of operations independent of the number of said bottom pads.

13. A via placement processor for placing vias on a PCB, said PCB having a plurality of top conductive pads on a top side of said PCB and having a plurality of bottom conductive pads on a bottom side of said PCB, said via placement processor receiving a list of top pad locations associated with top conductive pads of said PCB that are contacted by probes and a list of bottom pad locations organized into a predetermined pattern, said via placement processor comprising:

a nearest bottom pad locator which locates a nearest bottom pad to a selected top pad; and a clearance calculator which calculates a clearance distance between said selected top pad and said nearest bottom pad; and a via placement function which determines placement of a via internal to said nearest bottom pad if said calculated clearance distance is greater than or equal to a minimum clearance distance requirement, and which determines placement of a via external to said nearest bottom pad if said calculated clearance distance is less than said minimum clearance distance requirement.

14. A via placement processor in accordance with claim 13, wherein:

said nearest bottom pad locator obtains location coordinates associated with said selected top pad and calculates coordinates of said nearest bottom pad in a constant number of operations independent of the number of said bottom pads.

15. A method for determining placement of vias on a PCB, said PCB comprising a plurality of top pads on a top side of said PCB and a plurality of bottom pads on a bottom side of said PCB, said method comprising:

selecting a top pad of said PCB;

locating a nearest bottom pad of said PCB nearest to said selected top pad;

calculating a clearance distance between said selected top pad and said nearest bottom pad, said clearance distance comprising a minimum distance between a perimeter of said selected top pad and a perimeter of a via in a proposed via position within said nearest bottom pad; and determining whether said via may be placed internal to said nearest bottom pad based on said calculated clearance distance.

16. A method in accordance with claim 15, further comprising:

placing said via internal to said nearest bottom pad in said proposed via position if said calculated clearance distance meets a predetermined minimum clearance distance threshold.

17. A method in accordance with claim 16, further comprising:

placing said via external to said nearest bottom pad if said calculated clearance distance does not meet said predetermined minimum clearance distance threshold.

18. A method in accordance with claim 15, wherein said step for locating said nearest bottom pad comprises:

obtaining coordinates associated with said selected top pad;

obtaining coordinates associated with said plurality of bottom pads;

calculating a distance between each of said plurality of bottom pads and said selected top pad based on said coordinates associated with said selected top pad and each of said coordinates associated with said plurality of bottom pad;

selecting a bottom pad resulting in a smallest distance calculation.

19. A method in accordance with claim 15, wherein said step locating said nearest bottom pad comprises:

obtaining location coordinates associated with said selected top pad;

finding a bottom pad having coordinates of a closest match to said location coordinates associated with said selected top pad.

20. A method in accordance with claim 19, wherein said finding step comprises:

calculating coordinates of said bottom pad having coordinates of said closest match in a constant number of operations independent of the number of said bottom pads.

* * * * *